United States Patent
Likhanskii et al.

(10) Patent No.: US 9,478,399 B2
(45) Date of Patent: Oct. 25, 2016

(54) MULTI-APERTURE EXTRACTION SYSTEM FOR ANGLED ION BEAM

(71) Applicant: Varian Semiconductor Equipment Associates, Inc., Gloucester, MA (US)

(72) Inventors: Alexandre Likhanskii, Malden, MA (US); Svetlana B. Radovanov, Brookline, MA (US); William Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/070,880

(22) Filed: Mar. 15, 2016

(65) Prior Publication Data
US 2016/0284520 A1    Sep. 29, 2016

Related U.S. Application Data

(60) Provisional application No. 62/139,195, filed on Mar. 27, 2015.

(51) Int. Cl.
  *H01J 7/24*    (2006.01)
  *H01J 37/32*   (2006.01)
(52) U.S. Cl.
  CPC .... *H01J 37/32412* (2013.01); *H01J 37/32082* (2013.01); *H01J 37/32697* (2013.01)
(58) Field of Classification Search
  CPC ............... H01J 37/321; H01J 37/3244; H01J 37/32431
  USPC .................... 315/111.01, 111.51; 156/345.48
  See application file for complete search history.

(56) References Cited

U.S. PATENT DOCUMENTS

| 6,851,384 | B2* | 2/2005 | Yuda ................. C23C 16/402 |
| | | | 118/723 ER |
| 8,101,510 | B2 | 1/2012 | Godet et al. |
| 8,378,576 | B2 | 2/2013 | Abarra et al. |
| 9,017,526 | B2* | 4/2015 | Singh ............... H01J 37/32422 |
| | | | 156/345.1 |
| 9,257,295 | B2* | 2/2016 | Singh ............... H01J 37/32422 |
| 2008/0132046 | A1 | 6/2008 | Walther et al. |
| 2008/0179284 | A1* | 7/2008 | Hayes ................... H01J 27/18 |
| | | | 216/61 |
| 2008/0317968 | A1 | 12/2008 | Singh et al. |
| 2012/0104274 | A1* | 5/2012 | Hirayanagi ........... B82Y 10/00 |
| | | | 250/424 |
| 2014/0034611 | A1 | 2/2014 | Godet et al. |

(Continued)

FOREIGN PATENT DOCUMENTS

KR    10-2006-0099104 A    9/2006

OTHER PUBLICATIONS

International Search Report and Written Opinion mailed Jun. 22, 2016 in corresponding PCT application No. PCT/US2016/022595.

(Continued)

*Primary Examiner* — Thuy Vinh Tran

(57) ABSTRACT

An apparatus for creating an angled ion beam for implanting into a substrate is disclosed. The apparatus includes a plasma chamber in which plasma is created. The extraction aperture includes a plurality of rotatable plates. Ion beamlets are extracted through apertures defined by the plurality of rotatable plates. The degree to which these plates are rotated determines the angle of extraction for the extracted ion beam. These plates may be formed in a plurality of different shapes, which may increase the maximum extraction angle that is achievable. Additionally, electrodes may be disposed near the plates to affect the extraction angle.

20 Claims, 5 Drawing Sheets

(56) References Cited

U.S. PATENT DOCUMENTS

2014/0272179 A1    9/2014   Radovanov et al.
2016/0071693 A1    3/2016   Biloiu et al.
2016/0211156 A1*   7/2016   Singh ................ H01L 21/67213
                                                         156/345.52

OTHER PUBLICATIONS

"Center of Micronanotechnology CMI, Ion Beam Etcher Nexus IBE350 from Veeco," 2010, accessed Aug. 15, 2016, https://cmi.epfl.ch/etch/IBE350.php.

* cited by examiner

MULTI-APERTURE EXTRACTION SYSTEM FOR ANGLED ION BEAM

This application claims priority of U.S. Provisional Application Ser. No. 62/139,195 filed Mar. 27, 2015, the disclosure of which is incorporated herein by reference in its entirety.

FIELD

Embodiments of the present disclosure relate to apparatus for extracting an angled ion beam from a plasma chamber, and more particularly, an apparatus for extracting a low energy, high current angled ion beam.

BACKGROUND

The fabrication of a semiconductor device involves a plurality of discrete and complex processes. Recently, there has been a transition to create three dimensional devices in the semiconductor industry. As the name suggests, these semiconductor devices have a length and width, but also have a height. To process these three dimensional devices, angled ion implants may be used.

Angled ion implants refer to those ion beams which strike the substrate at a non-zero angle. For consistency, an angle of 0° is defined as one in which the ion beam strikes the substrate at an angle perpendicular to the surface of the substrate. Angled ion beams have many applications. For example, they may be used to implant a sidewall of a fin structure or a trench. Angled ion beams may also be used for etching processes, deposition processes and other applications.

One way to perform these angled ion implants is to rotate or tilt the platen on which the substrate is disposed. In other words, the ion beam is generated in the traditional manner, but the platen is tilted so that the ion beam strikes the substrate at a non-zero angle. This approach may allow the generation of an ion beam which strikes the substrate at an angle of 20° or more.

One shortcoming with this approach is that the various regions of the substrate are at different distances from the ion beam source. For example, by tilting, several regions of the substrate will be closer to the ion beam source than other regions. This may cause process variations across the substrate.

Another approach is to rotate the ion beam source with respect to the substrate to achieve the desired angle of the extracted ion beam. This approach has similar shortcomings as the previously described method of tilting the substrate.

Another approach is to control and vary the shape of the plasma sheath to vary the angle of the ions extracted from a plasma processing chamber. However, this approach may have limitations in terms of the amount of current that may be extracted.

Therefore, it would be advantageous if there was a system for generating a high current, low energy angled ion beam that did not suffer from these limitations. Further, it would be beneficial if the angle used for the ion implant was highly adjustable and easy to manipulate.

SUMMARY

An apparatus for creating an angled ion beam for implanting into a substrate is disclosed. The apparatus includes a plasma chamber in which plasma is created. The extraction aperture includes a plurality of rotatable plates. Ion beamlets are extracted through apertures defined by the plurality of rotatable plates. The degree to which these plates are rotated determines the angle of extraction for the extracted ion beam. These plates may be formed in a plurality of different shapes, which may increase the maximum angle of incidence that is achievable. Additionally, electrodes may be disposed near the plates to affect the extraction angle.

According to one embodiment, a plasma processing apparatus is disclosed. The plasma processing apparatus comprises a top surface; a plurality of sidewalls, defining a plasma processing chamber, the plasma processing chamber biased at an extraction voltage; an RF coil to energize a process gas to form a plasma in the plasma processing chamber; and a bottom surface comprising a plurality of plates, each plate pivotably attached to the bottom surface and biased at an extraction plate voltage, wherein ion beamlets are extracted through apertures defined by the plurality of plates. In certain embodiments, each of the plurality of plates comprises a straight portion. In certain embodiments, each of the plurality of plates comprises a first straight portion and a second straight portion extending from one end of the first straight portion. In certain further embodiments, each of the plurality of plates comprises a third straight portion extending from an opposite end of the first straight portion, in a direction opposite a direction of the second straight portion. In certain further embodiments, each of the plurality of plates comprises a triangular portion disposed at an opposite end of the first straight portion. In certain embodiments, the plurality of plates are rotated so that each one of the plurality of plates forms an angle between the bottom surface and the respective plate, and all of the plurality of plates form a same angle. In other embodiments, the plurality of plates form a plurality of different angles. In certain embodiments, the angle formed is varied based on a distance from the plate to a center of the plasma processing chamber. In certain embodiments, the bottom surface comprises a second plate biased at a voltage different than the extraction plate voltage. In some embodiment, the bottom surface comprises a plurality of electrodes biased at a second voltage different than the extraction plate voltage. In certain further embodiments, the plurality of electrodes comprises a plurality of rods, wherein the plurality of plates is disposed between the plurality of rods and the plasma processing chamber. In certain embodiments, the movement of the plurality of rods is related to the rotation of the plurality of plates. In some embodiment, the plurality of electrodes is biased at a second voltage more negative than the extraction plate voltage.

According to another embodiment, a plasma processing apparatus is disclosed. The plasma processing apparatus comprises a top surface; a plurality of sidewalls, defining a plasma processing chamber; an RF coil to energize a process gas to form a plasma in the plasma processing chamber; and a bottom surface comprising a plurality of plates, each plate pivotably attached to the bottom surface and biased at an extraction plate voltage, wherein ion beamlets are extracted through apertures defined by the plurality of plates; and a plurality of electrodes biased at a second voltage different than the extraction plate voltage, wherein each of the plurality of plates comprises an L-shaped element, comprising a first straight portion and a second straight portion extending from one end of the first straight portion, and each of the plurality of electrodes comprises an I-shaped element, comprising a straight portion, wherein the I-shaped element is disposed parallel to the first straight portion of the L-shaped element. In certain embodiments, a dielectric material is disposed between the I-shaped element and the L-shaped element. In certain embodiments, the second straight portion extends beyond the I-shaped element, shielding the I-shaped element from beam strike.

According to another embodiment, a plasma processing apparatus is disclosed. The plasma processing apparatus comprises a plasma processing chamber to create a plasma, having a bottom surface, wherein the bottom surface comprises a plurality of plates pivotably attached to the bottom surface, wherein ion beamlets are extracted through apertures defined by the plurality of plates, and wherein a rotation and voltage of each of the plurality of plates is adjusted to achieve a desired extraction angle. In certain embodiments, the plurality of plates are separated into groups, and the rotation of each group is independently controlled. In certain embodiments, the plurality of plates are separated into groups, and the voltage applied to each group is independently controlled.

BRIEF DESCRIPTION OF THE FIGURES

For a better understanding of the present disclosure, reference is made to the accompanying drawings, which are incorporated herein by reference and in which.

DETAILED DESCRIPTION

As described above, angled ion beam implants are becoming increasingly common in the semiconductor industry. Therefore, a system that allows a wide range of ion beam angles, and consequentially, a wide range of angles of incidence, while maintaining good angular spread, would be very beneficial.

Figure 1:
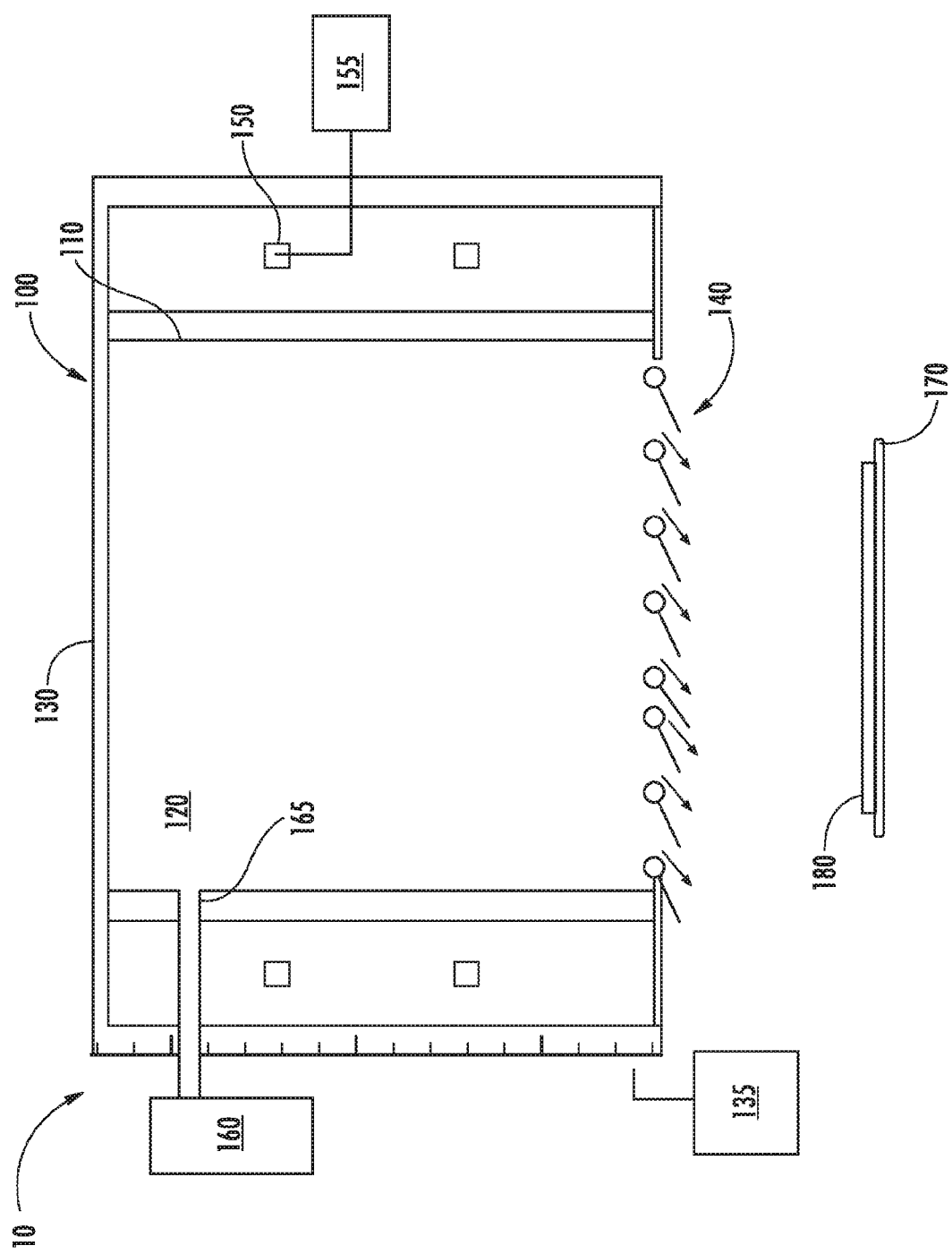
FIG. 1 is a block diagram of the system having a multi-aperture extraction system according to one embodiment.

FIG. 1 shows a plasma processing system 10 having a multi-aperture extraction system which allows for angled ion beam extraction. The plasma processing system 10 includes a plasma processing chamber housing 100, which comprises a plurality of sidewalls 110, which define a plasma processing chamber 120. Additionally, the plasma processing chamber housing 100 also includes a top surface 130 and a bottom surface 140. The bottom surface 140 is the surface from which the ion beam is extracted from the plasma processing chamber 120. As such, the bottom surface 140 may be referred to as the extraction plate or extraction area. The top surface 130 is the surface opposite the bottom surface 140.

The plasma processing system 10 also may include one or more gas storage containers 160, containing one or more processing gasses, which may be in communication with the plasma processing chamber 120 through a gas inlet 165. A valve, such as a mass flow controller, may be used to control the amount and rate at which the processing gas enters the plasma processing chamber 120. Although only one gas storage container 160 is illustrated, it is understood that there may be a plurality of different processing gasses used in the plasma processing chamber 120.

One or more RF coils 150 are disposed along the sidewalls 110 of the plasma processing chamber housing 100. These RF coils 150 are in communication with a RF power supply 155, which provides RF power to the RF coils 150. Although the RF coils 150 are shown as being disposed adjacent to the sidewalls 110, it is understood that the RF coils 150 may also be disposed on the top surface 130 of the plasma processing chamber housing 100. Further, RF coils 150 may be disposed on the top surface 130, as well as on the sidewalls 110. These RF coils 150 may be independently controlled. Thus, the location and control of the RF coils 150 is not limited by this disclosure.

In operation, processing gasses are introduced to the plasma processing chamber 120 via the gas inlet 165. RF power from the RF power supply 155 is provided to the RF coils 150. The RF coils 150 create RF energy, which causes the processing gasses within the plasma processing chamber 120 to become ionized and form plasma. This type of plasma processing chamber 120 may be referred to as an inductively coupled plasma (ICP) chamber.

One or more portions of the plasma processing chamber housing 100 may be biased at an extraction voltage. For example, the top surface 130 may be biased at the extraction voltage. In certain embodiments, the sidewalls 110 are also biased at the extraction voltage. Typically, one or more surfaces of the plasma processing chamber housing 100 are a dielectric material, while other surfaces may be conductive. For example, the surfaces that are proximate the RF coils 150 may be a dielectric material to allow the energy from the RF coils 150 to enter the plasma processing chamber 120. Other surfaces may be conductive. It is these conductive surfaces that may be biased at the extraction voltage. The extraction voltage may be defined as the voltage of the plasma processing chamber housing 100 relative to the substrate. When positive ions are to be extracted, the extraction voltage may be a positive D.C. voltage, such as about 500-2 kV. This may be achieved by biasing the plasma processing chamber housing 100 at a positive voltage, while the substrate is grounded. In other embodiments, the extraction voltage may be an RF voltage. This extraction voltage serves to repel the ions away from the plasma processing chamber housing 100.

As stated above, the extraction voltage is defined as the voltage of the plasma processing chamber housing 100 referenced to the substrate. Thus, in other embodiments, the plasma processing chamber housing 100 may be grounded, while the substrate 180 is biased at a negative voltage. In yet other embodiments, the substrate 180 may be biased with an AC voltage.

Disposed outside of the plasma processing chamber housing 100, and proximate the bottom surface 140 is a platen 170 on which a substrate 180 may be disposed. The platen 170 may be in communication with a bias power supply (not shown), which supplies a bias voltage to the platen 170.

When the platen 170 is biased more negatively than the plasma processing chamber housing 100, ions within the plasma processing chamber 120 are attracted toward the platen 170 and pass through apertures in the bottom surface 140. The difference in potential between the plasma processing chamber housing 100 and the bias voltage, referred to as the extraction voltage, as noted above, may determine the energy of the ions that are implanted into the substrate 180.

In the present embodiment, the bottom surface 140 comprises a plurality of plates and apertures that allow for angled extraction of the ion beam. FIGS. 2-7 are various embodiments of the plurality of plates and apertures that may be used to form the bottom surface 140. The apertures are defined by the plurality of plates, and more particularly, by the spacing between adjacent plates. As such, FIGS. 2-7 each represent an expanded or magnified view of a portion of the bottom surface 140 and the structure of the plates and apertures contained therein according to different embodiments.

The bottom surface 140 may be parallel to the substrate 180. In other words, the angled implant is performed without having to rotate the substrate 180 or plasma processing chamber housing 100 relative to the other.

While FIGS. 2-7 each show three plates, it is understood that the bottom surface 140 may comprise any suitable number of plates. The space between any two adjacent plates forms an aperture, through which the ions from the plasma processing chamber 120 may be extracted in the form of ion beamlets.

Further, in each of the embodiments described below, representative dimensions are provided. However, it is understood that the disclosure is not limited to the dimensions recited herein. For example, each of the plates may range in length from a few millimeters to a few centimeters. Additionally, the thickness of the plates may range from 1 mm to several millimeters.

Further, in each of the embodiments described below, it is assumed that positive ions are being extracted from the plasma processing chamber housing.

In all of the embodiments described herein, the plates may be all controlled by an actuator 135 such that all plates form the same angle between the plate and the plane of the bottom surface 140. In other embodiments, the plates may be independently controlled so that each plate may form an angle relative to the bottom surface 140 that is not related to any other plate. Of course, the plates may be controlled in groups, such that each group of plates moves together, but independently of the other groups. In these embodiments, a plurality of actuators 135 may be used. The actuator may be a rotary motor, a linear actuator, or may be a rod. Further, the actuator may be automated or may be operated by manual intervention.

Further, in each of these embodiments, the plates may be biased at an extraction plate voltage, such as the extraction voltage or a different voltage through the use of an extraction plate power supply 195 (see FIGS. 2-7). In some embodiments, this extraction plate power supply 195 may be used to provide the extraction voltage to the plasma processing chamber housing 100. In other embodiments, the extraction plate power supply 195 may only be in communication with the plates. Further, although one extraction plate power supply 195 is illustrated, it is understood that multiple extraction plate power supplies may be used in any embodiment. Further, as described above, in other embodiments, the plates may be grounded while the substrate 180 is negatively biased. Thus, in certain embodiments, the extraction plate voltage may be equal to the extraction voltage. In other embodiments, the extraction plate voltage may be different than the extraction voltage. For example, in the case of a positive extraction voltage, the extraction plate voltage may be less positive than the extraction voltage.

The extraction plate power supply 195 may be referenced to ground, the extraction voltage or to the substrate. If referenced to the extraction voltage, the extraction plate power supply 195 may supply a non-positive voltage, such as ground or a negative voltage. If the extraction plate power supply 195 is referenced to the substrate, the extraction plate power supply 195 may supply a positive voltage. Throughout this disclosure, the extraction plate voltage will be defined as being referenced to the substrate 180.

Figure 2:
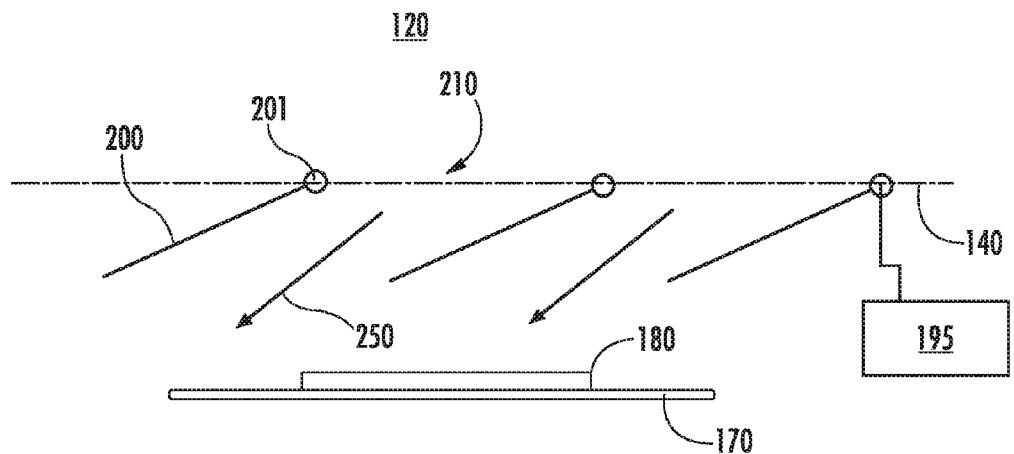
FIG. 2 is a side view of the plates used to form the multi-aperture extraction system shown in FIG. 1 according to one embodiment.

FIG. 2 represents a first embodiment of the structure of the plates and apertures disposed in the bottom surface 140. In this embodiment, the bottom surface 140 includes a plurality of plates 200, which may be parallel and rotatable. These plates 200 comprise a straight portion, similar to a slat. These plates 200 are rotatably attached to the bottom surface 140, such as at proximal end 201. In other embodiments, the plates 200 may be rotatably attached to the bottom surface 140 at a different location, such as the midpoint of each plate 200.

In certain embodiments, each plate 200 may be about 5 mm long, although other dimensions are also possible. The spacing between adjacent plates 200 may also be about 5 mm, although other dimensions are possible. The openings between adjacent plates 200 form apertures 210, through which the ion beamlets 250 may be extracted. Each of the plates 200 can rotate from a closed, or nearly closed, position where the plate 200 is parallel or nearly parallel to the bottom surface 140, to an open position where the plate 200 is perpendicular to the bottom surface 140. In the closed position, ions are not extracted from the plasma processing chamber 120, while in the open position, the ion beamlets 250 are extracted at an angle perpendicular to the substrate 180. The angle in the closed position is referred to as 0°, while the angle in the open position is referred to as 90°. The plates 200 may also assume any position between the open position and the closed position. In other words, as used herein, extraction angle refers to the angle formed between the plane parallel to the bottom surface 140 and the plate 200. Angle of incidence refers to the angle formed between the plane parallel to the substrate 180 and the ion beamlets 250.

In certain embodiments, all of the plates 200 are biased at an extraction plate voltage that is equal to the extraction voltage using the extraction plate power supply 195. In other embodiments, the extraction plate voltage may be less positive than the extraction voltage. In this way, when the substrate 180 becomes more negatively biased than the plasma processing chamber housing 100, ion beamlets 250 are attracted to the substrate 180. The positive ions in the ion beamlets 250 are repelled by the plates 200, and thus exit through the apertures 210 in a highly collimated manner with small angular spread. Thus, the ion beamlets 250 may exit the plasma processing chamber 120 at the angle formed by the plates 200. Therefore, if all plates 200 are at the same angle relative to the bottom surface 140, an ion beamlet 250 will be extracted through each aperture 210, and all of these ion beamlets 250 will travel parallel to one another. However, after exiting the plasma processing chamber 120, the only force acting on the ion beamlets 250 is the force of attraction due to the negative electrical potential of the platen 170. This force of attraction tends to reduce the angle of incidence of the ion beamlets 250 on the substrate 180 relative to the extraction angle. In other words, if the plates 200 are set at a 30° angle with respect to the bottom surface 140, the ion beamlets 250 will be extracted from the plasma processing chamber 120 at roughly a 30° angle. However, the ion beamlets 250 will likely contact the substrate 180 at a smaller angle, such as 15-20°, as the ions are pulled toward the substrate 180. This example is representative of the movements of the ion beamlets 250 and the embodiment is not limited to this example. The distance between the bottom surface 140 and the substrate 180 may also affect the angle of incidence of the ion beamlets 250. In one test, a maximum angle of incidence of about 15° was achieved.

In certain embodiments of FIG. 2, the extraction plate voltage applied to the plates 200 may vary. For example, the plates 200 may be grouped together in a plurality of groups, where each group of plates 200 has an independently controllable voltage applied thereto. In certain embodiments, each group may comprise only one plate 200. In other embodiments, each group may comprise a plurality of plates 200. The extraction plate voltages applied to each of these groups may be separately controllable using a plurality of extraction plate power supplies 195, and may range from 0V to the extraction voltage. By applying different voltages to the various groups of plates 200, different incident angles and different energies may be created.

Figure 3:
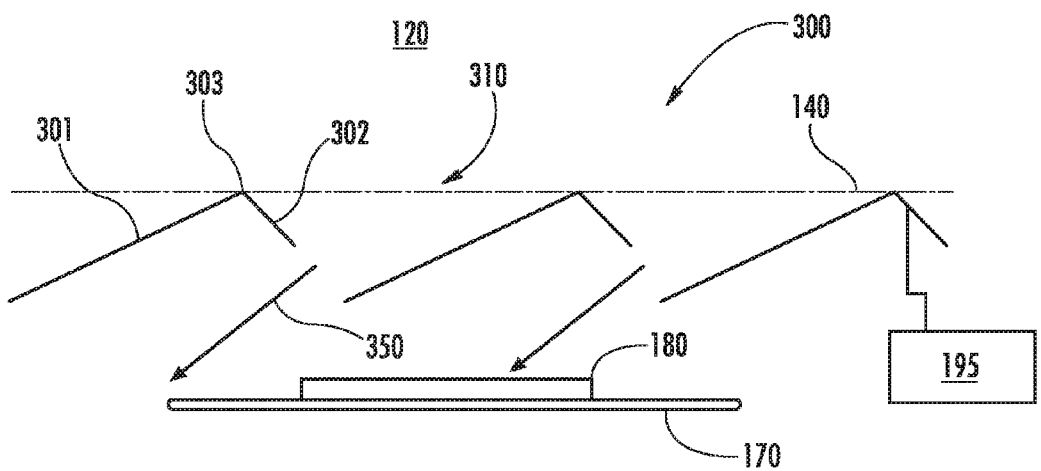
FIG. 3 is a side view of the plates used to form the multi-aperture extraction system shown in FIG. 1 according to another embodiment.

FIG. 3 shows another embodiment. In this embodiment, each of the plates 300 comprises a first straight portion 301, and a second straight portion 302, shorter than the first straight portion 301. The first straight portion 301 and the second straight portion 302 meet at a junction 303. In certain embodiments, the plates 300 may be rotatably attached to the bottom surface 140 at the junction 303, although other attachment points are also possible. The first straight portion 301 may be about 7 mm in length, while the second straight portion 302 may be about 2 mm in length. The first straight portion 301 and the second straight portion 302 may meet at a right angle, although other angles are also possible. Because of their shape, plates 300 may be referred to as L-shaped plates or L-shaped elements.

Like the plates 200 in FIG. 2, the plates 300 may rotate between an open position, where ion beamlets 350 are extracted at an angle of 90° and a closed position, also referred to as 0°. The plates 300 may assume any position therebetween. The plates 300 may be shaped such that the second straight portion 302 blocks part of the aperture 310 created between adjacent plates 300. This may create greater spacing between adjacent ion beamlets 350.

In certain embodiments, the plates 300 are all biased at an extraction plate voltage that is equal to the extraction voltage using extraction plate power supply 195. In other embodiments, the extraction plate voltage may be less positive than the extraction voltage. In this way, the ion beamlets 350 are repelled away from the plates 300, causing them to be extracted in a collimated manner. Further, this configuration may allow all of the extracted ion beamlets 350 to be parallel to one another. As described above, in other embodiments, the plates 300 may be groups into a plurality of groups, where the voltage applied to each group may be independently controlled using a plurality of extraction plate power supplies 195. This may vary the extraction angle and the energy of the ion beamlets 350. In yet other embodiments, the plates 300 may be grounded or biased using an RF voltage.

The inclusion of the second straight portion 302 modifies the electrical fields and the plasma sheath, and may allow a greater maximum angle of incidence than can be achieved by the plates 200 in FIG. 2. In one test, a maximum angle of incidence between the ion beamlets 350 and the substrate 180 of about 23.5° was achieved.

Figure 4:
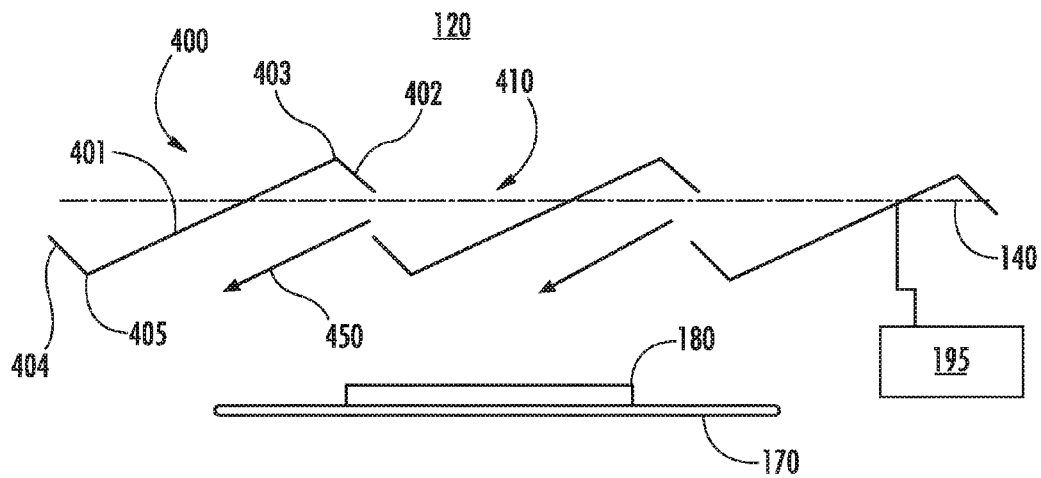
FIG. 4 is a side view of the plates used to form the multi-aperture extraction system shown in FIG. 1 according to another embodiment.

FIG. 4 shows another embodiment. In this embodiment, each of the plates 400 comprises a center straight portion 401, a second straight portion 402, shorter than the center straight portion 401 and a third straight portion 404, also shorter than the center straight portion 401. The center straight portion 401 and the second straight portion 402 meet at a first junction 403. The center straight portion 401 and the third straight portion 404 meet at a second junction 405 at the opposite end of the center straight portion 401. The second straight portion 402 and the third straight portion 404 extend from the center straight portion 401 in opposite directions, and thus may be referred to as S-shaped plates or S-shaped elements.

In certain embodiments, the plates 400 may be rotatably attached to the bottom surface 140 at the first junction 403, although other attachment points are also possible. For example, the plates 400 may be rotatably attached at the midpoint of the center straight portion 401 in certain embodiments. Like the plates in the previous embodiments, the plates 400 may rotate between an open position, where ion beamlets 450 are extracted at an angle of 90° and a closed position, also referred to as 0°. The plates 400 may assume any position therebetween.

The center straight portion 401 may be about 10 mm in length, while the second straight portion 402 and the third straight portion 404 may each be about 2 mm in length. The center straight portion 401 and the second straight portion 402 may meet at a right angle, although other angles are also possible. Similarly, the center straight portion 401 and the third straight portion 404 may also meet at a right angle, although other angles are also possible.

In certain embodiments, all of the plates 400 are biased at an extraction plate voltage that is equal to the extraction voltage using the extraction plate power supply 195. In other embodiments, the extraction plate voltage may be less positive than the extraction voltage. In this way, the ion beamlets 450 are repelled away from the plates 400 as they pass through apertures 410. As described above, in other embodiments, the plates 400 may be grouped into a plurality of groups, where the extraction plate voltage applied to each group may be independently controlled using a plurality of extraction plate power supplies 195. In yet other embodiments, the plates 400 may be grounded or biased using an RF voltage.

The existence of second straight portion 402 and third straight portion 404 may alter the plasma sheath and the electrical fields near the plates 400 and may allow a greater maximum angle of incidence than the plates of FIGS. 2-3. For example, in one test, a maximum angle of incidence between the ion beamlets 450 and the substrate 180 of 25° was achieved.

Figure 5:
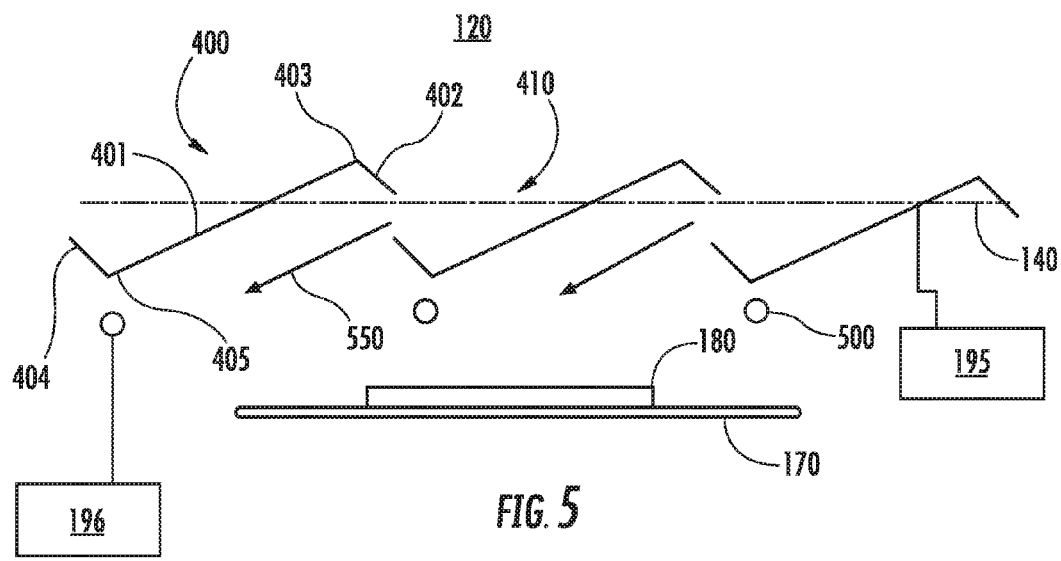
FIG. 5 is a side view of the plates used to form the multi-aperture extraction system shown in FIG. 1 according to another embodiment.

FIG. 5 shows another embodiment, which is a variation of the embodiment shown in FIG. 4. In this embodiment, the plates 400 are the same as those shown in FIG. 4, and therefore will not be described again. In this embodiment, a plurality of electrodes, which may be rods 500, is disposed below the bottom surface 140. In some embodiments, these rods 500 may be fixed in place. In other embodiments, the rods 500 move as a function of the angle of the plates 400. For example, the rods 500 may move so that they remain directly beneath the second junction 405.

In certain embodiments, all of the plates 400 are biased at an extraction plate voltage that is equal to the extraction voltage using the extraction plate power supply 195, while the electrodes are maintained at a different electrical potential using electrode power supply 196. For example, in certain embodiments, the rods 500 are grounded. Of course, the extraction plate voltage may be less positive than the extraction voltage, as described above. Thus, the ion beamlets 550 are both repelled from the plates 400 and attracted to the rods 500. This change in the electrical field may affect the maximum angle of incidence that may be achieved. For example, the use of rods 500, when grounded, may increase the maximum angle of incidence as compared to FIG. 4.

In other embodiments, the electrodes may not all be maintained at the same electrical potential. For example, the rods 500 may be grouped into groups, where the voltage applied to each group is independently controlled using a plurality of electrode power supplies 196.

Further, in certain embodiments, the plates 400 may be grouped into a plurality of groups, where the extraction plate voltage applied to each group may be independently controlled using a plurality of extraction plate power supplies 195.

In certain embodiments, the rods 500 and the plates 400 may each be grouped into groups which are independently controlled.

This may allow a wide range of incident angles and implant energies.

Further, in certain embodiments, the electrodes may not be rods, but may have another shape.

In certain embodiments, the plates 400 are biased at an extraction plate voltage, while the electrodes are based at a second voltage, different than the extraction plate voltage. In certain embodiments, the second voltage is more negative than the extraction plate voltage. In other words, the extraction plate voltage may be a positive voltage, while the second voltage is a less positive voltage, a negative voltage or ground. Alternatively, the extraction plate voltage may be ground, and the second voltage may be a negative voltage.

Although FIG. 5 is illustrated as a variation of the embodiment of FIG. 4, it is understood that the electrodes may be added to any of the embodiments described herein. In other words, the existence of electrodes and the shape of the plates are independent of one another.

Figure 6:
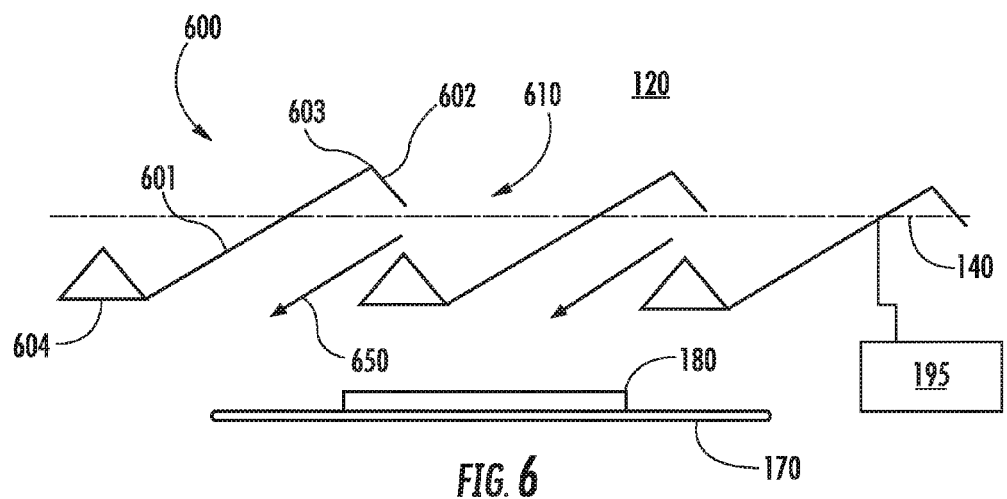
FIG. 6 is a side view of the plates used to form the multi-aperture extraction system shown in FIG. 1 according to another embodiment.

FIG. 6 shows another embodiment. In this embodiment, each of the plates 600 comprises a center straight portion 601, a second straight portion 602, shorter than the center straight portion 601 and a triangular portion 604, disposed on the opposite end of the center straight portion 601. The center straight portion 601 and the second straight portion 602 meet at a first junction 603. The center straight portion 601 and the triangular portion 604 meet at the opposite end of the center straight portion 601. The second straight portion 602 and the triangular portion 604 extend from the center straight portion 601 in opposite directions. While the triangular portion 604 is shown as being solid, the disclosure is not limited to this embodiment. For example, the triangular portion 604 may be hollow in certain embodiments. Further, other shapes may also be used. For example, rectangles, circles, ellipses and other polygons may also be used.

In certain embodiments, the plates 600 may be rotatably attached to the bottom surface 140 at the first junction 603, although other attachment points are also possible. For example, the plates 600 may be rotatably attached at the midpoint of the center straight portion 601 in certain embodiments. The center straight portion 601 may be about 10 mm in length, while the second straight portion 602 may be about 2 mm in length. The center straight portion 601 and the second straight portion 602 may meet at a right angle, although other angles are also possible. The triangular portion 604 may comprise an equilateral triangle where each side is about 2 mm in length. Of course, other differently sized triangular portions may be employed.

Like the previous embodiments, in certain embodiments, all of the plates 600 are biased at the extraction plate voltage using the extraction plate power supply 195, and thus the ion beamlets 650 are repelled away from the plates 600 as they pass through apertures 610. The extraction plate voltage may be equal to or less positive than the extraction voltage. As described above, in other embodiments, the plates 600 may be grouped into a plurality of groups, where the extraction plate voltage applied to each group may be independently controlled using a plurality of extraction plate power supplies 195. The existence of second straight portion 602 and the triangular portion 604 alter the electrical fields near the plates 600 and may allow a greater maximum angle of incidence than the plates of FIGS. 2-4. For example, in one test, a maximum angle of incidence of 28° was achieved.

In yet other embodiments, the plates 600 may be grounded or biased using an RF voltage.

Figure 7:
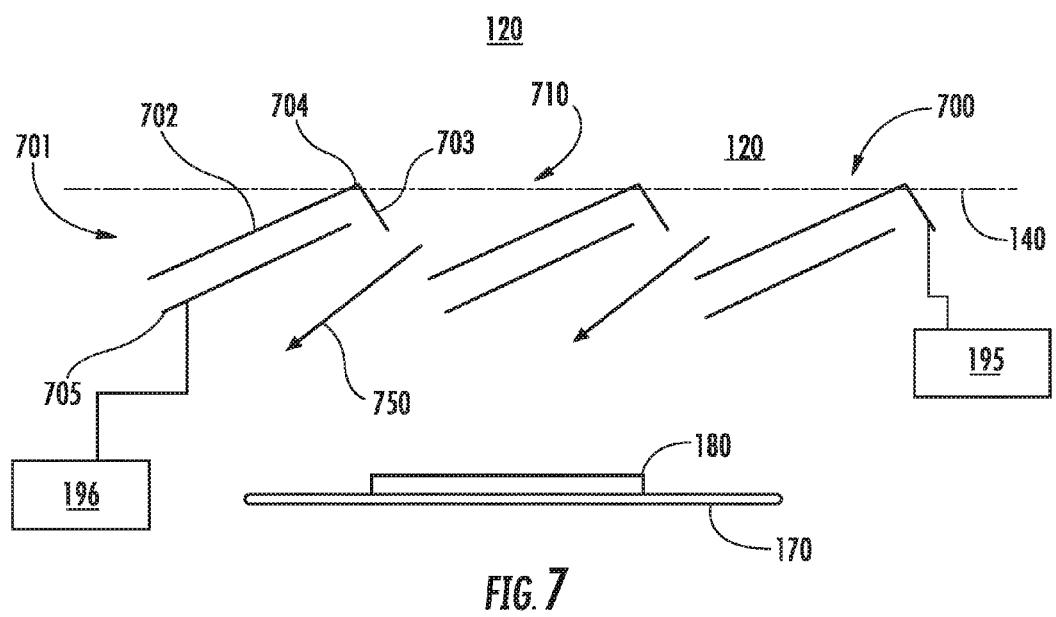
FIG. 7 is a side view of the plates used to form the multi-aperture extraction system shown in FIG. 1 according to another embodiment.

FIG. 7 shows another embodiment. In this embodiment, each of the plates 700 comprises two elements, where these two elements may be biased at different electrical potentials. In FIG. 7, the plates 700 comprise an L-shaped element 701 and an I-shaped element 705, which may be straight. The L-shaped element 701 includes a first straight portion 702, and a second straight portion 703, shorter than the first straight portion 702. The first straight portion 702 and the second straight portion 703 meet at a junction 704. The first straight portion 702 and the second straight portion 703 may meet at a right angle, although other angles are also possible. The surface from which the second straight portion 703 extends from may be referred to as the interior surface of the L-shaped element 701.

The I-shaped element 705 is disposed proximate the L-shaped element 701, such that the I-shaped element 705 is parallel to the first straight portion 702 and disposed along the interior surface of the L-shaped element 701. The I-shaped element 705 may be bonded to the L-shaped element 701 using a dielectric material so as to prevent arcing. As shown in FIG. 7, the second straight portion 703 may extend over one end of the I-shaped element 705. This second straight portion 703 may serve to shield the I-shaped element 705 from the ion beamlets 750 so as to minimize beam strike. Thus, the plate 700 has a first straight portion 702 and an adjacent second straight portion 703, which are formed by the L-shaped element 701. Opposite and parallel to the first straight portion 702 is the I-shaped element 705. As described above, the second straight portion 703 may extend beyond the thickness of the I-shaped element 705.

In certain embodiments, the plates 700 may be rotatably attached to the bottom surface 140 at the junction 704, although other attachment points are also possible. The first straight portion 702 may be about 7 mm in length, while the second straight portion 703 may be about 2 mm in length. The I-shaped element 705 may be about 6 mm in length.

In certain embodiments, all of the L-shaped elements 701 may be biased at the extraction plate voltage using extraction plate power supply 195. The extraction plate voltage may be equal to or less positive than the extraction voltage. As described above, the L-shaped elements 701 may be grouped into groups, where the extraction plate voltage applied to each group is independently controlled using a plurality of extraction plate power supplies 195. In yet other embodiments, the L-shaped elements 701 may be grounded or biased using an RF voltage.

The I-shaped elements 705 may be biased at a different voltage than the L-shaped elements 701 using electrode power supply 196. In one embodiment, the I-shaped elements 705 are grounded. In another embodiment, the I-shaped elements 705 may be in communication with an electrode power supply 196 capable of supplying any voltage between ground and the extraction plate voltage. In certain embodiments, the voltage applied to the I-shaped elements 705 may be negative. Like the L-shaped elements 701, the I-shaped elements 705 may be grouped into groups, where the voltage applied to each group is independently controlled using a plurality of electrode power supplies 196.

By varying the voltage applied to the I-shaped element 705, the maximum angle of incidence may be greatly increased. For example, in one test, an angle of incidence between the ion beamlets 750 and the substrate 180 of 47-50° was achieved.

While FIG. 7 shows L-shaped elements 701, other shapes may be used. For example, in certain embodiments, the L-shaped elements 701 may also comprises a third straight portion, extending from the opposite end of the first straight portion 702. This third straight portion may extend in the same direction as the second straight portion 703 and serve to shield the I-shaped element 705 from beam strike on three sides.

Figure 8:
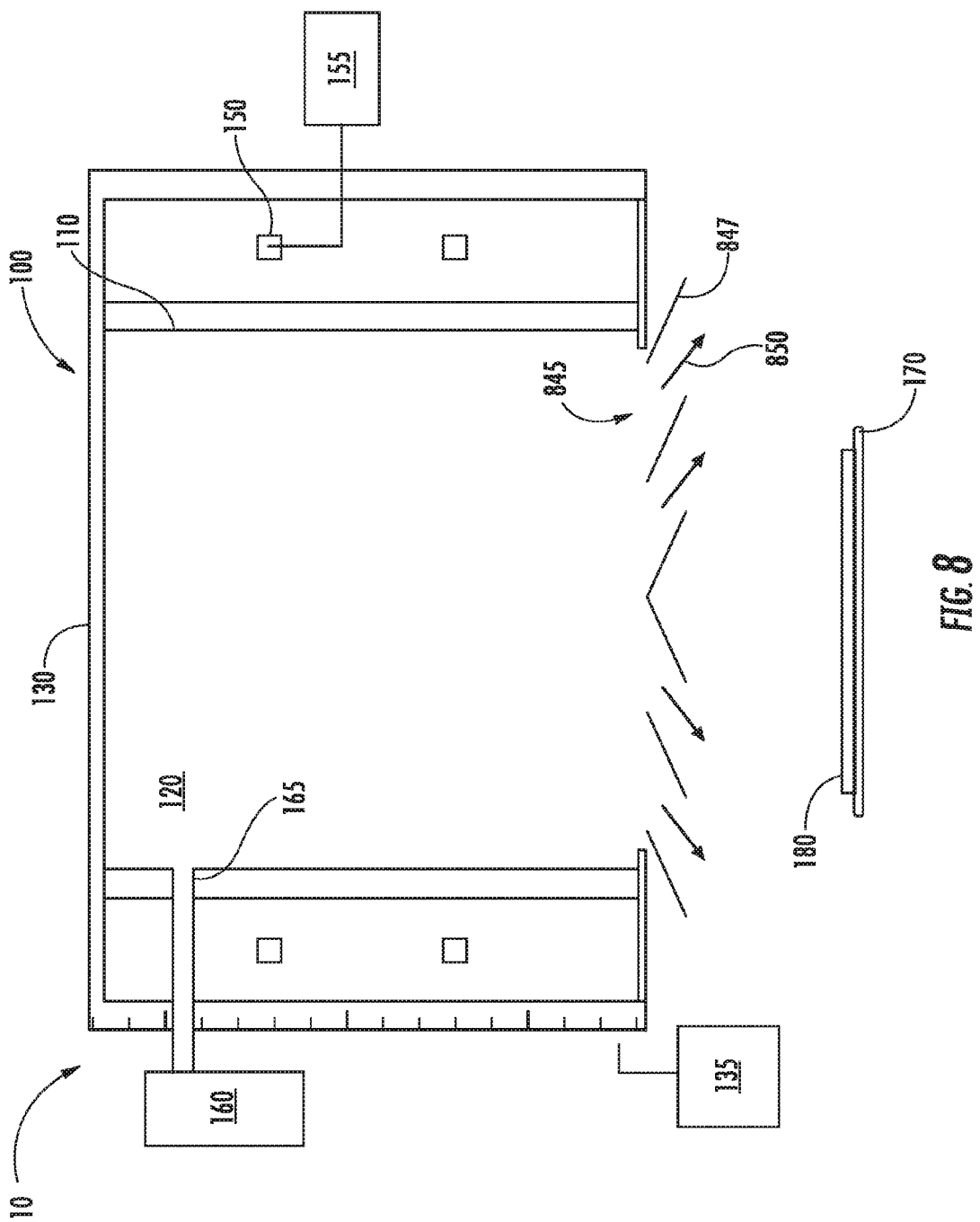
FIG. 8 is a block diagram of a plasma processing chamber having a multi-aperture extraction system according to another embodiment.

The previous embodiments all show the plates all oriented in the same direction. However, other embodiments are also possible. For example, FIG. 8 shows another embodiment of a plasma processing system 10 having a multi-aperture extraction system. All components that are similar to those shown in FIG. 1 are given the same reference designators and are not described here.

In this embodiment, the apertures 845 and plates 847 are oriented symmetrically about the center of the plasma processing chamber 120. By arranging the plates 847 symmetrically about the center of the plasma processing chamber 120, the effect of non-uniform plasma density distribution may be reduced. For example, in one embodiment, the extraction angle of the plates 847 and the ion beamlets 850 may vary as a function of distance from the center of the plasma processing chamber 120.

Additionally, although not shown, in certain embodiments, different shaped plates are used in the bottom surface 140. For example, the bottom surface 140 may comprise a plurality of plates, some of which may be shaped according to any of the embodiments shown in FIGS. 2-7.

As noted above, the disclosure assumed the extraction of positive ions. However, other embodiments are also possible. For example, in certain embodiments, negative ions may be extracted. In this embodiment, the extraction voltage is negative and the extraction plate voltage is equal to or less negative than the extraction voltage. Additionally, the voltage applied to the electrodes may be more positive than the extraction plate voltage.

The embodiments described above in the present application may have many advantages. The present system allows for the extraction of ion beamlets having high currents at high extraction angles. This allows the ions to strike the substrate at a high angle of incidence, such as greater than 15°. In some embodiments, the angle of incidence may be greater than 25°. In certain embodiments, the angle of incidence may approach 40° or more.

Further, the plasma processing chamber housing 100 allows adjustment of the extraction angle using multiple techniques. For example, the extraction angle may be adjusted by varying the voltage applied to the plates. Additionally, the extraction angle may be adjusted by varying the rotation of the plates in the bottom surface 140. In some embodiments, the bottom surface 140 also includes electrodes, which may also be biased to allow the extraction angle to be varied in another way.

Additionally, the extraction angle may be further manipulated by adjusting the extraction plate voltage and the voltage applied to the electrodes, providing another mechanism to control the extraction angle.

Further, unlike some techniques, the distance between the region of the substrate being implanted and the plasma processing chamber housing, and particularly the bottom surface 140, is constant for all regions of the substrate, since the bottom surface 140 is parallel to the substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma processing apparatus, comprising:
a top surface;
a plurality of sidewalls, defining a plasma processing chamber, the plasma processing chamber biased at an extraction voltage;
an RF coil to energize a process gas to form a plasma in the plasma processing chamber; and
a bottom surface comprising a plurality of plates, each plate pivotably attached to the bottom surface and biased at an extraction plate voltage, wherein ion beamlets are extracted through apertures defined by the plurality of plates.

2. The plasma processing apparatus of claim 1, wherein each of the plurality of plates comprises a straight portion.

3. The plasma processing apparatus of claim 1, wherein each of the plurality of plates comprises a first straight portion and a second straight portion extending from one end of the first straight portion.

4. The plasma processing apparatus of claim 3, wherein each of the plurality of plates comprises a third straight portion extending from an opposite end of the first straight portion, in a direction opposite a direction of the second straight portion.

5. The plasma processing apparatus of claim 3, wherein each of the plurality of plates comprises a triangular portion disposed at an opposite end of the first straight portion.

6. The plasma processing apparatus of claim 1, wherein the plurality of plates are rotated so that each one of the plurality of plates forms an angle between the bottom surface and the respective plate, and all of the plurality of plates form a same angle.

7. The plasma processing apparatus of claim 1, wherein the plurality of plates are rotated so that each one of the plurality of plates forms an angle between the bottom surface and the plate, and the plurality of plates form a plurality of different angles.

8. The plasma processing apparatus of claim 1, wherein the plurality of plates are rotated so that each one of the plurality of plates form an angle between the bottom surface and the plate, and the angle formed is varied based on a distance from the plate to a center of the plasma processing chamber.

9. The plasma processing apparatus of claim 1, wherein the bottom surface comprises a second plate biased at a voltage different than the extraction plate voltage.

10. The plasma processing apparatus of claim 1, wherein the extraction plate voltage is equal to or less positive than the extraction voltage.

11. The plasma processing apparatus of claim 1, wherein the bottom surface comprises:
   a plurality of electrodes biased at a second voltage different than the extraction plate voltage.

12. The plasma processing apparatus of claim 11, wherein the plurality of electrodes comprises a plurality of rods, wherein the plurality of plates is disposed between the plurality of rods and the plasma processing chamber.

13. The plasma processing apparatus of claim 12, wherein movement of the plurality of rods is related to rotation of the plurality of plates.

14. The plasma processing apparatus of claim 11, wherein the plurality of electrodes is biased at a second voltage more negative than the extraction plate voltage.

15. A plasma processing apparatus, comprising:
   a top surface;
   a plurality of sidewalls, defining a plasma processing chamber;
   an RF coil to energize a process gas to form a plasma in the plasma processing chamber; and
   a bottom surface comprising:
      a plurality of plates, each plate pivotably attached to the bottom surface and biased at an extraction plate voltage, wherein ion beamlets are extracted through apertures defined by the plurality of plates; and
      a plurality of electrodes biased at a second voltage different than the extraction plate voltage,
   wherein each of the plurality of plates comprises an L-shaped element, comprising a first straight portion and a second straight portion extending from one end of the first straight portion, and each of the plurality of electrodes comprises an I-shaped element, comprising a straight portion, wherein the I-shaped element is disposed parallel to the first straight portion of the L-shaped element.

16. The plasma processing apparatus of claim 15, wherein a dielectric material is disposed between the I-shaped element and the L-shaped element.

17. The plasma processing apparatus of claim 15, wherein the second straight portion extends beyond the I-shaped element, shielding the I-shaped element from beam strike.

18. A plasma processing apparatus, comprising:
   a plasma processing chamber to create a plasma, having a bottom surface, wherein the bottom surface comprises a plurality of plates pivotably attached to the bottom surface, wherein ion beamlets are extracted through apertures defined by the plurality of plates, and wherein a rotation and voltage of each of the plurality of plates is adjusted to achieve a desired extraction angle.

19. The plasma processing apparatus of claim 18, wherein the plurality of plates are separated into groups, and the rotation of each group is independently controlled.

20. The plasma processing apparatus of claim 18, wherein the plurality of plates are separated into groups, and the voltage applied to each group is independently controlled.

* * * * *